United States Patent
Lundin et al.

(10) Patent No.: US 6,445,317 B2
(45) Date of Patent: *Sep. 3, 2002

(54) ADAPTIVELY CALIBRATING ANALOG-TO-DIGITAL CONVERSION

(75) Inventors: Henrik Lundin, Sollentuna; Peter Händel, Stockholm; Mikael Skoglund, Tullinge; Mikael Pettersson, Uppsala, all of (SE)

(73) Assignee: Telefonaktiebolaget L M Ericsson (publ), Stockholm (SE)

( * ) Notice: Subject to any disclaimer, the term of this patent is extended or adjusted under 35 U.S.C. 154(b) by 0 days.

This patent is subject to a terminal disclaimer.

(21) Appl. No.: 09/738,229

(22) Filed: Dec. 15, 2000

Related U.S. Application Data

(63) Continuation-in-part of application No. 09/596,803, filed on Jun. 19, 2000, which is a continuation-in-part of application No. 09/196,811, filed on Nov. 20, 1998, now Pat. No. 6,127,955.

(51) Int. Cl.[7] .............................................. H03M 1/10
(52) U.S. Cl. ........................................ 341/120; 341/118
(58) Field of Search ................................. 341/120, 118

(56) References Cited

U.S. PATENT DOCUMENTS

| | | | |
|---|---|---|---|
| 4,535,319 A | 8/1985 | Penney ........................ 340/347 |
| 4,736,189 A | 4/1988 | Katsumata et al. ......... 340/347 |
| 4,903,023 A | 2/1990 | Evans et al. ................. 341/120 |
| 4,903,024 A | 2/1990 | Evans et al. ................. 341/120 |
| 5,101,205 A | 3/1992 | Yasuda ........................ 341/155 |
| 5,266,951 A | 11/1993 | Kuegler et al. ............. 341/120 |
| 5,361,067 A | 11/1994 | Pinckley ..................... 341/120 |
| 5,499,027 A | 3/1996 | Karanicolas et al. ........ 341/120 |
| 5,644,308 A | * 7/1997 | Kerth et al. ................. 341/120 |
| 5,754,973 A | 5/1998 | Akune ......................... 704/205 |
| 5,771,012 A | * 6/1998 | Shu et al. .................... 341/118 |
| 5,793,319 A | * 8/1998 | Ard ............................. 341/120 |
| 5,861,828 A | 1/1999 | Opris .......................... 341/120 |
| 5,990,814 A | * 11/1999 | Croman et al. ............. 341/118 |
| 6,127,955 A | * 10/2000 | Handel et al. .............. 341/120 |

FOREIGN PATENT DOCUMENTS

WO     WO 00/31876     6/2000

OTHER PUBLICATIONS

Digital–Domain Calibration of Multistep Analog–to–Digital Converters, by Seung–Hoon Lee and Bang–Sup Song, Senior Member, IEEE; IEEE Journal of Solid–State Circuits; vol. 27, No. 12, Dec. 1992, pp. 1679–1688.

(List continued on next page.)

*Primary Examiner*—Peguy Jeanpierre
(74) *Attorney, Agent, or Firm*—Jenkens & Gilchrist, P.C.

(57) ABSTRACT

A method, arrangement, and system enable adaptive calibration of an analog-to-digital converter (ADC) from reference signals with unknown parameter(s) that may vary (e.g., a varying frequency). An analog reference signal s(t) is supplied to an ADC to be calibrated. The output x(n) of the ADC is used by a, e.g., sine-wave reconstruction filter to reconstruct an estimate ŝ(n) of the sampled instances of the signal s(t). A recursive frequency estimator within the sine-wave reconstruction filter produces a frequency estimate of the analog reference signal s(t) from the signal x(n). An adaptive reconstruction filter uses this frequency estimate and the signal x(n) to produce the estimate ŝ(n). When a convergence detector determines that the adaptive reconstruction filter has converged, the estimate ŝ(n) is used to alter values that are stored in a correction table. During functional operation of the ADC, the correction table is used to correct the output values of the ADC.

47 Claims, 8 Drawing Sheets

OTHER PUBLICATIONS

Predictive Digital Filtering of Sinusoidal Singals, by Peter Händel, Member, IEEE IEEE Transactions on Signal Processing, vol. 46, No. 2, Feb. 1998, pp. 364–374.

Single–Tone Parameter Estimation from Discrete–Time Observations by David C. Rife, Senior Member, IEEE, and Robert R. Boorstyn, Member, IEEE, IEEE Transactions on Information Theory, vol. IT–20, No. 5, Sep. 1974, pp. 591–598.

Digital Signal Processing–Principles, Algorithms and Applications by J.G. Proakis and D.M. Manolakis, Prentice Hall International, Third Edition, 1996, Chapter 9.2, pp. 748–763.

Least Squares Quantization in PCM by Stuart P. Lloyd, IEEE Transactions on Information Theory, vol. IT–28, No. 2, Mar. 1982, pp. 129–137.

1989 IEEE International Symposium on Circuits and Systems; Real–Time Equalization of A/D Converter Nonlinearities by D. Moulin; Portland, OR, May 8–11, 1989, vol. 1, No. Symp. 22, May 8, 1989, pp. 262–267, XP000131234; Institute of Electrical and Electronics Engineers.

John M. Richardson; Correlation of a Signal with an Amplitude–Distorted Form of Itself; IEE Transacations on Information Theory, vol. IT–20, No. 5, Sep.; p. 598.

IEEE STD–1241 Standard For Terminology and Test Methods for Analog–to–Digital Converters, pp 45–48.

Tilden, Linnenbrink and Green; Overview of the IEEE–STD–1241 Standard For Terminology and Test Methods for Analog–to–Digital Converters; $16^{th}$ IEEE Instrsumentation and Measurement Techology Converence, 1999; IMTC/99, vol. 3, pp 1498–1503.

* cited by examiner

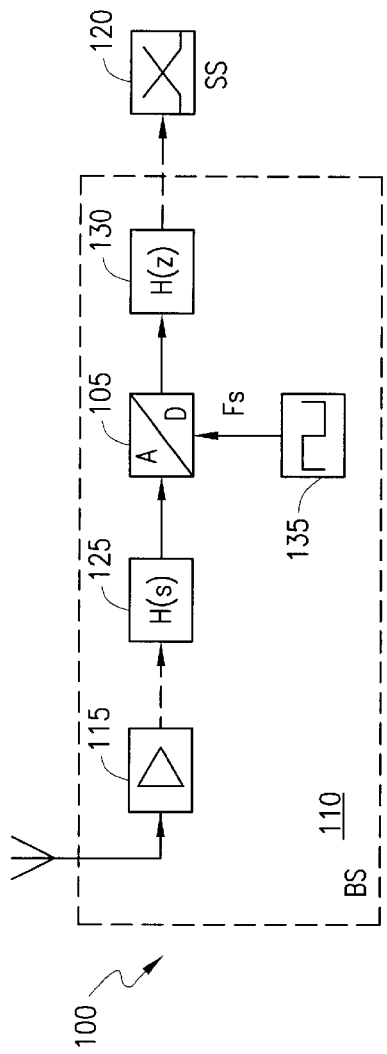
FIG. 1
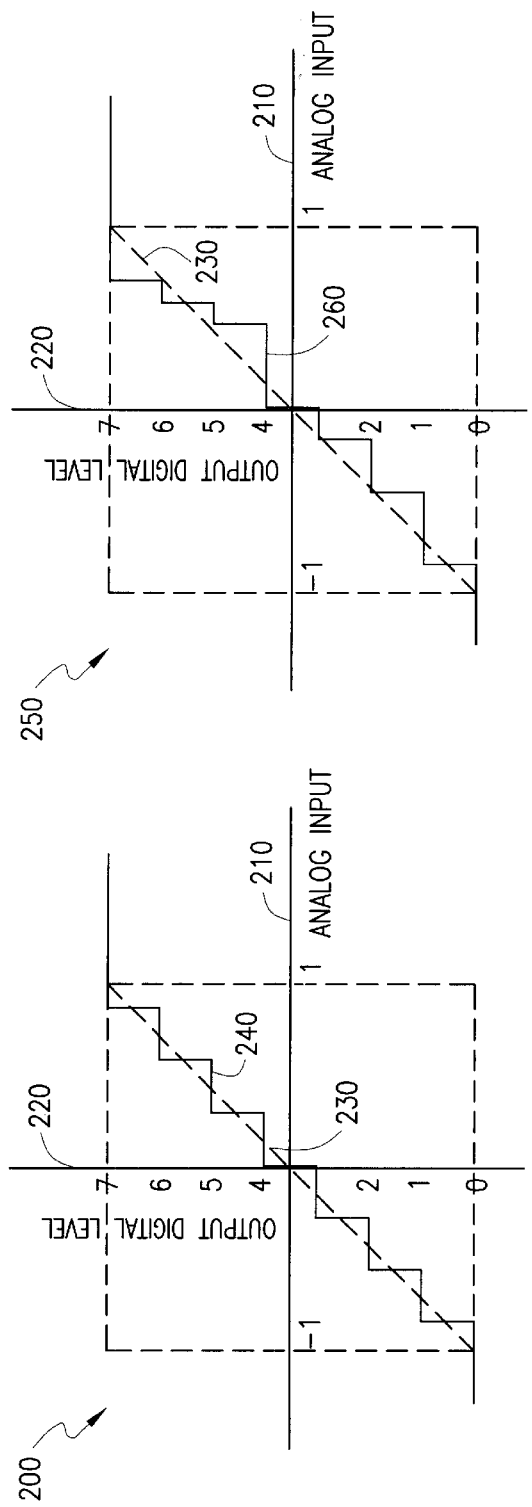
FIG. 2A
FIG. 2B

ADAPTIVELY CALIBRATING ANALOG-TO-DIGITAL CONVERSION

This Nonprovisional Application for Patent is a continuation-in-part of U.S. Nonprovisional Application for U.S. Pat. No. 09/596,803, filed Jun. 19, 2000, which is a continuation-in-part of U.S. Nonprovisional Application for U.S. Pat. No. 09/196,811, filed Nov. 20, 1998, now U.S. Pat. No. 6,127,955, both of which are hereby incorporated by reference in their entirety herein.

BACKGROUND OF THE INVENTION

1. Technical Field of the Invention

The present invention relates in general to the field of analog-to-digital converters (ADCs), and in particular by way of example but not limitation, to digital calibration of ADCs in which the calibration may be accomplished adaptively with dynamic estimation of reference signals that have unknown parameters.

2. Description of Related Art

The natural world operates in an analog domain, but information signals (voice, data, etc.) may frequently be processed, transmitted, or otherwise manipulated more efficiently in the digital domain. The conversion from the analog domain to the digital domain is accomplished with ADCs. An ADC receives as input an analog signal and produces as output a digital signal. However, some information present in the analog signal is necessarily lost during the conversion process even if an ADC is operating in an ideal manner. Unfortunately, real-world ADCs do not operate in an ideal manner. Consequently, the digital output of a real-world ADC does not track the analog input even as accurately an ideal ADC.

It is therefore beneficial to make and/or tune real-world ADCs to approximate ideal ADCs. Techniques have been developed to calibrate real-world ADCs so as to modify their performance to emulate ideal ADCs as closely as possible. For example, ADCs are traditionally calibrated using high precision digital voltmeters to characterize the errors that result from digitizing static or slowly varying analog reference voltages. The outcome from this static testing forms the basis for a hardware or software implemented calibration scheme. Another method of conventional ADC calibration is the use of a sinusoidal reference signal. The reference is sampled, and estimations of the ideal sample values are calculated. These estimations are calculated using a minimum squared error criterion that requires knowledge of the frequency of the calibration signal. The errors (i.e., the difference between the estimated values and the actual sampled values output by the ADC being calibrated) are then used to build a correction table. The correction table may subsequently be used to modify sampled values of actual (e.g., non-calibration, functional, etc.) analog input signals.

Efficient calibration schemes require that the reference signal be dynamically estimated on a sample-by-sample basis during the ADC calibration period(s). No method previously existed for dynamic estimation of a reference signal (e.g., a calibration signal) with one or more unknown parameters (e.g., frequency, phase, etc.) during an ADC calibration. The pre-existing calibration procedures relied on accurate and costly signal generators and/or precise and expensive measuring components.

However, the parent application (U.S. Ser. No. 09/196, 811, now U.S. Pat. No. 6,127,955) addressed these deficiencies of pre-existing calibration procedures by dynamically estimating a reference signal having one or more unknown parameters. Nevertheless, the invention of the parent application was primarily directed, with respect to frequency estimation, to the problem of calibrating ADCs that operate in a narrow frequency band. Since the linearity errors in general are frequency dependent, correction tables in accordance with the invention of the parent application are primarily useful for frequencies near the calibration frequency. The invention of the parent application does not therefore address the problem of wide-band calibration of ADCs. Consequently, implementations in accordance with the invention of the parent application do not optimally calibrate ADCs that are to be operated in a broad frequency band.

SUMMARY OF THE INVENTION

The deficiencies of the prior art are overcome by the method, arrangement, and system of the present invention. To wit, the present invention is directed to a method, arrangement, and system for enabling adaptive calibration of an analog-to-digital converter (ADC) from reference signals with unknown parameter(s). For example, a reference signal having at least one unknown parameter that varies may be advantageously employed in order to calibrate an ADC over wide ranges of the unknown parameter(s) (e.g., over a wide frequency range).

In certain embodiments, an analog reference signal s(t) is supplied to an ADC to be calibrated. The output x(n) of the ADC is used by a, e.g., sine-wave reconstruction filter to reconstruct an estimate ŝ(n) of the sampled instances of the signal s(t). A recursive frequency estimator within the sine-wave reconstruction filter produces a frequency estimate of the analog reference signal s(t) from the signal x(n). An adaptive reconstruction filter uses this frequency estimate and the signal x(n) to produce the estimate ŝ(n). When a convergence detector determines that the adaptive reconstruction filter has converged, the estimate ŝ(n) is used to alter values that are stored in a correction table. During functional operation of the ADC, the correction table is used to correct the output values of the ADC.

The above-described and other features of the present invention are explained in detail hereinafter with reference to the illustrative examples shown in the accompanying drawings. Those skilled in the art will appreciate that the described embodiments are provided for purposes of illustration and understanding and that numerous equivalent embodiments are contemplated herein.

BRIEF DESCRIPTION OF THE DRAWINGS

A more complete understanding of the method, arrangement, and system of the present invention may be had by reference to the following detailed description when taken in conjunction with the accompanying drawings wherein:

FIG. 1 illustrates an exemplary ADC environment in which the present invention may be advantageously implemented;

FIG. 2A illustrates an exemplary analog input signal versus digital output signal graph of an ideal ADC;

FIG. 2B illustrates an exemplary analog input signal versus digital output signal graph of a practical ADC;

DETAILED DESCRIPTION OF THE DRAWINGS

Figure 3A:
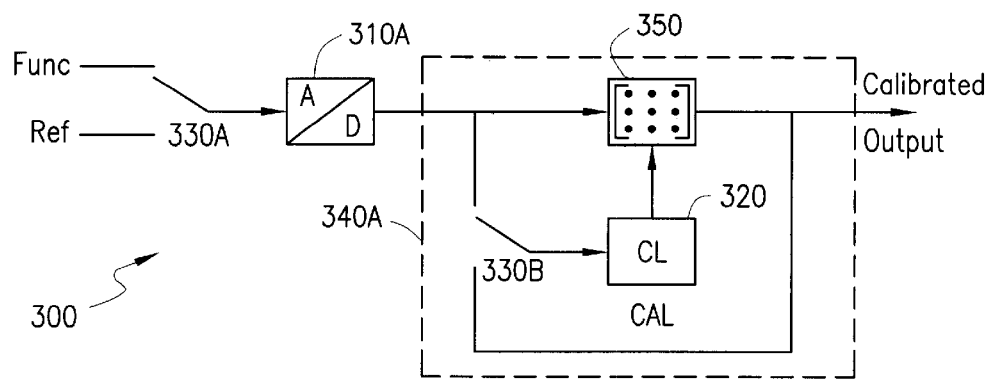
FIG. 3A illustrates an exemplary application of calibration in accordance with the present invention.

A preferred embodiment of the present invention and its advantages are best understood by referring to FIGS. 1–9B of the drawings, like numerals being used for like and corresponding parts of the various drawings.

Referring now to FIG. 1, an exemplary ADC environment in which the present invention may be advantageously implemented is illustrated. An ADC 105 is shown as part of a telecommunications system environment 100. Specifically, environment 100 includes a receiver 115 of a mobile radio system base station (BS) 110 in communication with a telephone switching system (SS) 120 (e.g., a node in a wireline system). The receiver 115 provides an analog incoming signal (e.g., transmitted from a mobile station (MS) (not shown) of the mobile radio system) to an analog filter H(s) 125 that limits the bandwidth of the ADC 105 analog input signal to one Nyquist zone. The digital output signal of the ADC 105 is connected to a digital filter H(z) 130, which may further filter the incoming signal. The output of the digital filter H(z) 130 may be processed further and forwarded to the SS 120.

The ADC 105 converts a time continuous and amplitude continuous signal to a time discrete and amplitude discrete signal. The output data rate of the ADC 105 is controlled by a sampling clock generator 135 with frequency $F_s$, which is also the data rate of the ADC output. The ADC 105 may optionally include a sample and hold (S/H) circuit (not shown in FIG. 1), which holds an instantaneous value of the (analog filtered) analog input signal, which is received from the analog filter H(s) 125, at selected instants of time so that the ADC 105 may sample them.

The ADC 105 quantizes each sampled analog input signal into one of a finite number of levels and represents (e.g., codes) each level into a bit pattern that is delivered as the digital output at the rate of the sampling clock generator 135. The digital output of the ADC 105 is composed of an exemplary number of eight (8) bits. Hence, 256 levels may be represented. The telecommunications system environment 100 will be used to describe a preferred embodiment of the present invention. However, it should be understood that the principles of the present invention are applicable to other ADC environments, such as video implementations, delta modulation, a flash ADC, an integrating ADC, pulse code modulation (PCM), a sigma-delta ADC, and a successive approximation ADC.

Referring now to FIG. 2A, an exemplary analog input signal versus digital output signal graph of an ideal ADC is illustrated. The ideal ADC graph is shown generally at 200. The abscissa axis 210 represents the analog input, and the ordinate axis 220 represents the level of digital output. The dashed diagonal line 230 represents a linear, non-quantized output response for the analog input signal; it is used here as an aiming line for the quantized output. The corresponding output of the ideal ADC is represented by the stair-stepped line 240. As can be seen, the ideal ADC digital output 240 tracks the analog input 230 as accurately as possible with a given number of quantization levels (e.g., resolution) and sampling rate.

Referring now to FIG. 2B, an exemplary analog input signal versus digital output signal graph of a practical ADC is illustrated. The practical ADC graph is shown generally at 250. The dashed diagonal line 230 is again shown as an aiming line for ideal mid-step transition of the digital output. The corresponding output of the practical ADC is represented by the roughly stair-stepped line 260. As can be seen, the practical ADC digital output 260 does not track the analog input 230 as accurately as does the ideal ADC (of FIG. 2A) with the same given number of quantization levels and sampling rate. Thus, it can be seen that the effective number of bits $b_{EFF}$ of a b-bit ADC may differ from the actual number of bits (b) due to errors (e.g., offset errors, gain errors, and linearity errors). The ADC calibration principles of the present invention advantageously ameliorate these various error conditions.

Application of the ADC calibration principles of the present invention and/or invention of the parent application provides many advantages over conventional approaches. For example, robustness against variations in the analog calibration signal is provided. There is no need for highly-stable signal generators because the present invention and/or invention of the parent application calculates relevant parametrical information from quantized samples of the calibration signal utilizing prior knowledge of the waveform type. The calibration signal may be generated by a low-complexity, low-precision (but spectrally pure) local oscillator included in the system using the ADC (e.g., the system may be an integrated circuit (IC), BS, etc.). The present invention allows for a design using two ADCs that switches between reference and functional input signals, where one ADC is being calibrated while the other is running functionally. Using this solution, the calibrated ADC(s) may be sensitive to temperature drift without requiring the cessation of functional data conversion while implementing repetitive calibration.

Another exemplary advantage of the present invention and/or invention of the parent application is increased efficiency as compared to conventional solutions. Because the filter (as explained further below) yields a better estimation of the reference signal than prior methods, fewer samples of the reference signal are needed for calibration. Additionally, the calibration scheme may be fully implemented in software. If the system the ADC is connected to has sufficient overflow capacity, then no additional digital signal processing (DSP) resources (e.g., hardware, processing cycles, etc.) are needed. In principle, the calibration may be made transparently during normal operation and delayed by only a memory access by utilizing, for example, a known pilot, as explained further below. The correction table may therefore be trained incrementally with short bursts of samples from the pilot tone used as a reference signal, thus allowing for a design using only one ADC, which is alternately connected to the reference signal and calibrated incrementally during known intermissions of the incoming functional signal.

A pilot is a signal which stands apart from the information portion of the overall signal channel, but is carried by the same physical transmission medium. The pilot may occupy just one frequency in the utilized signal band (a so-called pilot tone), and the information may be spread in frequency to the side or around the pilot, but not on the same frequency as the pilot. A pilot is often used to adjust the system to carry the information with as high a quality as possible. Because the pilot has well-known characteristics, it may be measured and used to adjust signal level, synchronize clocks, etc., regardless of the information carried on the channel. In accordance with the principles of the present invention and/or invention of the parent application, the pilot signal, which may already be present in the relevant system for other purposes, may be used as a reference signal to calibrate the ADC.

A still further advantage provided by application of the principles of the present invention and/or invention of the parent application is that the calibration scheme adapts to the reference signal, requiring knowledge of the waveform type only. This allows for both a calibration procedure using several different frequencies and a design using an extended correction table. The correction table addressing is then extended with addresses depending upon the difference between the value of the previous sample and that of the current sample. This corrects the dynamic aspect of the errors in the ADC. Moreover, improvement of the linearity may be enhanced still further by preloading the correction table and using the output thereof for the calibration scheme. Thus, the calibrator becomes a feedback system. The improvement is due, at least in part, to the more-accurate amplitude estimation of the reference signal.

Referring now to FIG. 3A, an exemplary application of calibration in accordance with the present invention is illustrated. An ADC 310A and calibrator 340A are shown generally at 300. The ADC 310A may receive an analog functional input signal, and the calibrator 340A produces a digital calibrated output signal. The ADC 310A may be, for example, equivalent to the ADC 105 (of FIG. 1), and the calibrator 340A may include a correction table 350. When the ADC 310A is to be processing an incoming functional signal, a switch 330A is connected to the functional signal, and a switch 330B need not be connected to the output of the ADC 310A. However, when the functional signal is engaged in a known intermission, for example, the switch 330A is connected to the reference signal, and the switch 330B connects the output of the ADC 310A to the calibration logic (CL) 320. The CL 320 may produce correction table outputs for the correction table 350. In this manner, the speed of the CL 320 of the present invention enables real-time calibration with only a single ADC 310A. It should be understood that the switch 330B may alternatively be part of the calibrator 340A.

Thus, the switch 330A serves to switch between the functional operating mode and the calibration operating mode. The switch 330B, on the other hand, also enables a feedback system to be activated during calibration. The calibration procedure may therefore be accomplished in two phases. In the first phase, the switch 330B is connected to the ADC 310A output. When the correction table 350 has been trained, the switch 330B is connected to the output of the correction table 350, which enables a finer tuning of the table. The ADC 310A and the calibrator 340A of 300, for example, may benefit from calibration using a pilot tone. For example, if there is a pilot tone with an amplitude using most of the ADC 310A input range on the functional signal and if there exists a known intermission in the information carrying part of the spectrum, then this intermission can be used for ADC calibration using the pilot as a calibrating reference.

Figure 3B:
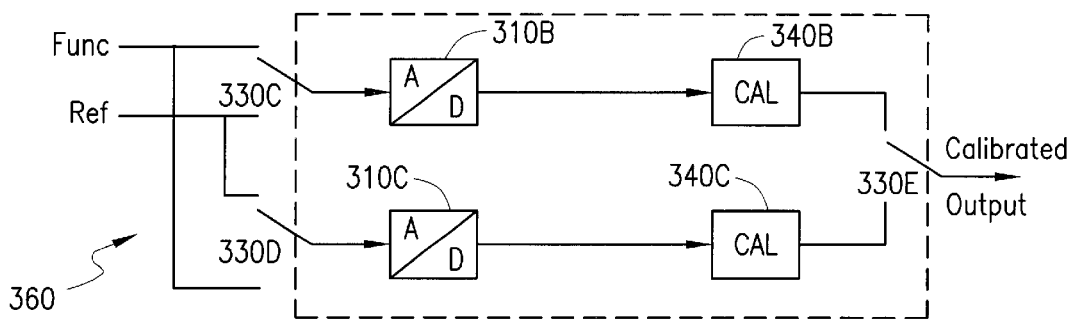
FIG. 3B illustrates another exemplary application of calibration in accordance with the present invention.

Referring now to FIG. 3B, another exemplary application of calibration in accordance with the present invention is illustrated. The present invention also enables real-time calibration with two ADCs as shown generally at 360. A reference signal and a functional signal are alternately input to a pair of ADCs 310B and 310C via switches 330C and 330D, respectively. While one is receiving the reference signal, the other is receiving and operating on the functional signal. ADC 310B and 310C forward their outputs as inputs to calibrators 340B and 340C, respectively. Switch 330E selects, for providing as the calibrated output, the forwarded digital signal that corresponds to the analog functional input signal. In this manner, calibration may be constantly in process, if desired. Advantageously, this two-ADC exemplary application enables, during a normal calibration operation, calibration to account for drift and changes during the normal operation.

It should be noted that the calibration resources may be shared, except for the correction table 350. In other words, a single calibrator 340 may alternatively receive the output of the ADCs 310B and 310C (e.g., by means of a switch) (not shown). The three switches 330C, 330D, and 330E may be synchronized. The switch transition is preferably a fraction of the sampling period so that functional converted data passing through the system is not interrupted. In the exemplary application 360, the ADCs 310B and 310C preferably do not have an internal delay in order for all the switches to be in the same phase. This may be solved, however, with a delay of the output switch 330E (not explicitly shown).

Figure 4A:
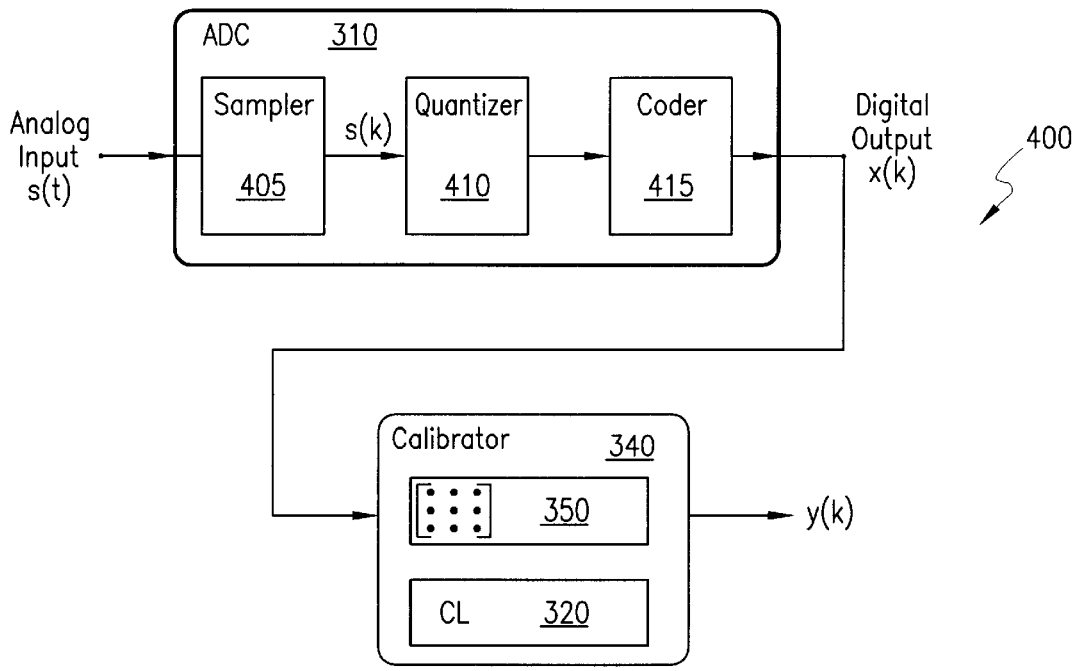
FIG. 4A illustrates an exemplary ADC and an associated calibrator with selected signals denoted in accordance with the present invention.

Referring now to FIG. 4A, an exemplary ADC and an associated calibrator are illustrated with selected signals denoted in accordance with the present invention. An exemplary ADC 310 and an exemplary calibrator 340 are shown generally at 400. The analog input signal s(t) (e.g., an airborne radio wave analog voice signal emanating from an MS transmitter (not shown), received at the receiver 115 (of FIG. 1), and frequency downconverted and filtered inside the BS 110) is supplied to the ADC 310. The ADC 310 may correspond to, for example, the ADC 105 of the BS 110 (of FIG. 1). It should be understood that the ADC 310 (and hence the ADC 105) may include the calibrator 340.

Continuing with FIG. 4A, the ADC 310 may include, for example, a sampler 405, a quantizer 410, and a coder 415. It should be understood, however, that the present invention is applicable to other ADC designs. The sampler 405 samples the incoming analog input signal s(t) and produces the time discrete sampled signal s(k), which is forwarded to the quantizer 410. The signal is then converted to the digital output x(k) by the quantizer 410 and the coder 415. The digital output x(k) is supplied to the calibrator 340, which includes the correction table 350 and the CL 320. The calibrator 340 then produces the calibrated digital signal y(k).

Figure 4B:
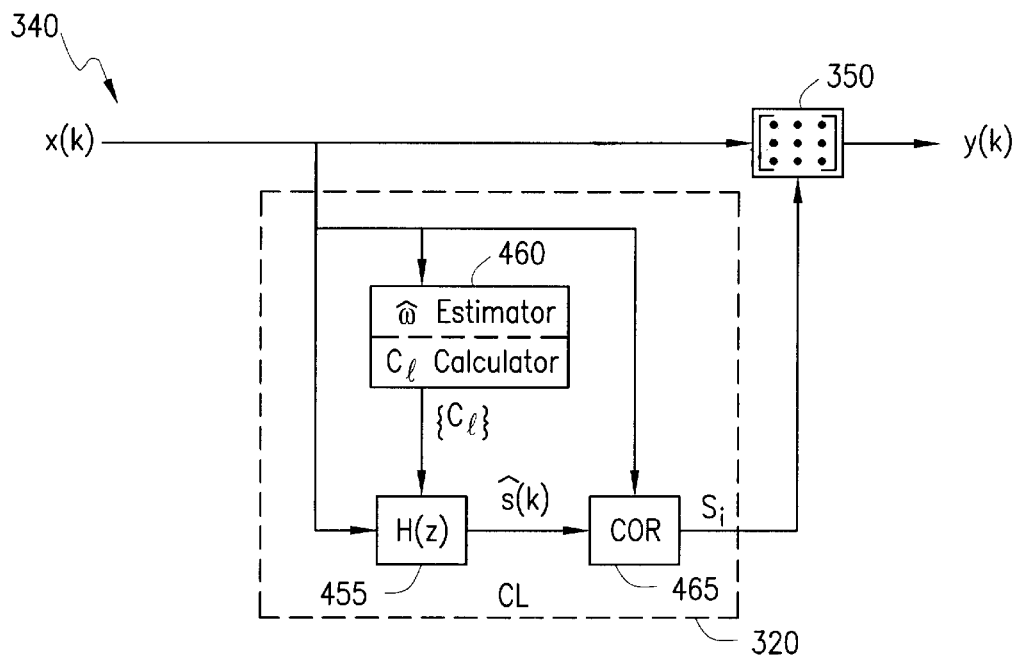
FIG. 4B illustrates exemplary details of one embodiment of calibration logic in accordance primarily with the invention of the parent application.

Referring now to FIG. 4B, exemplary details of one embodiment of calibration logic in accordance primarily with the invention of the parent application are illustrated. The calibrator 340 is shown receiving the digital output signal x(k) of the ADC 310 (of FIG. 4A) and producing the calibrated digital signal y(k). The calibrator 340 includes the correction table 350 and the CL 320. The digital output signal x(k) is supplied to three exemplary components of the CL 320, which are described in mathematical detail below. First, the digital output signal x(k) is supplied as an input to an estimator/calculator 460. The estimator/calculator 460 (i) estimates at least one parameter (e.g., the frequency ω) relating to the analog input reference signal s(t) and (ii) calculates coefficients (e.g., the coefficients $c_A$). Second, the digital output signal x(k) is supplied as an input (along with the coefficients $c_A$ to a finite impulse response (FIR) filter 455. The FIR filter 455 produces an estimate of s(k) (e.g., ŝ(k)), where s(k) may, for example, correspond to the output of the sampler 405 (of FIG. 4A). It should be noted that other filter types may alternatively be used. For example, an Infinite Impulse Response (IIR) filter may be used in place of the FIR filter 455.

Third, the correction calculator 465 also receives the digital output signal x(k) as an input. The correction calculator 465 computes table entries (e.g., the values of $s_i$) for the correction table 350 using the digital output signal x(k) along with the calculated ŝ(k) from the FIR filter 455. During calibration operation mode, the digital output signal x(k) is used to address the correction table 350, and the output of the correction table $s_i$ is the data written/stored to the table entry for that address. The correction table 350 may be, for example, stored in a memory (e.g., a random access memory (RAM) or a serial access memory (SAM)). It should be understood that the correction table 350 need not be in tabular form, for it may be organized into any convenient data structure.

During functional operation mode, the digital output signal x(k) continues to be used to address the correction table 350, but the value of the table entry at that address is read/retrieved and then output as the variable y(k). Hence, the digital output signal x(k) is passed through the correction table 350 in both functional and calibration operation modes. The correction table 350 is preferably initialized with $s_i=x_i$ for every input level (i=0, . . . , M−1) before functional use of the y(k) data and before any calibration (such initialization is not explicitly shown). The calibration may thus be performed later when a scheduled calibration phase occurs in the system.

Each of the functional units (components) shown in the calibrator 340 are described more fully in mathematical form below. It should be understood that the FIR filter 455, the estimator/calculator 460, and the correction calculator 465 need not be discrete electronic hardware units. Each may alternatively be implemented (either fully or partially) in software using, for example, a general purpose DSP. Furthermore, each may be implemented using excess computing capacity in whatever system (e.g., a BS) in which the calibrator 340 and the ADC 310 are being employed. Moreover, each may be implemented in either hardware, software, firmware, etc., or some combination thereof and/or share resources such as memory and/or processor cycles. It should be further understood that the calibrator 340 may be incorporated as part of the ADC 310.

Figure 4C:
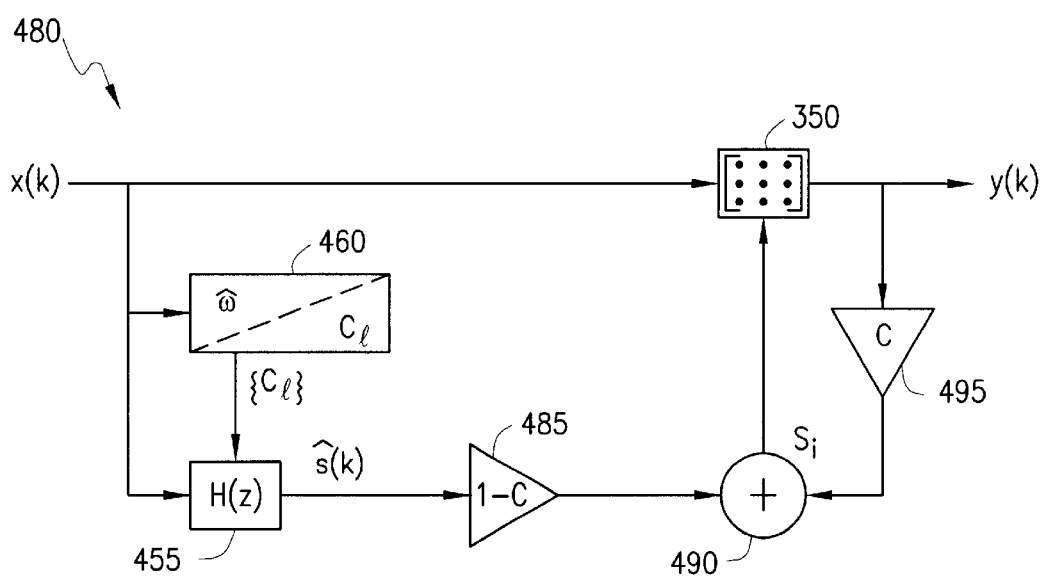
FIG. 4C illustrates exemplary details of another embodiment of calibration logic in accordance primarily with the invention of the parent application.

Referring now to FIG. 4C, exemplary details of another embodiment of calibration logic in accordance primarily with the invention of the parent application are illustrated. The exemplary details of this calibration logic embodiment are designated generally by 480 and are specially targeted for implementations in which the number of calibration samples may be limited. In the calibrator 480, the correction calculator 465 (of the calibrator 340 of FIG. 4B) is replaced by a "(1-C)" multiplier 485, a summer 490, and a "C" multiplier 495, which forms a feedback loop from the output of the correction table 350. The input $s_i$ to the correction table 350 therefore becomes the sum of $Cs_i$ and $(1-C)$ŝ(k). Calibrator 480 will likewise be explained in greater mathematical detail below.

Multiple schemes have previously been proposed in order to calibrate ADCs. In fact, a calibration scheme has recently been proposed that works in the digital domain only in S.-H. Lee and B.-S. Song, "Digital-domain calibration of multistep analog-to-digital converters", IEEE Journal on Solid-State Circuits, Vol. 27, No. 12, pp. 1679–1688, 1992, which is hereby incorporated by reference in its entirety herein. One drawback with a method such as the one in Lee and Song's article is that it requires accurate signal generators and measurement devices to measure the code errors.

In contradistinction, the calibration scheme for ADCs in accordance with the present invention and/or invention of the parent application does not require such accurate signal generators and measurement devices. The scheme may be implemented fully digitally and completely in software. Furthermore, it does not require internal calibration circuitry. The calibration scheme does entail, on the other hand, a calibration signal connected to the ADC input. It also may include the storing of code errors directly in memory; consequently, the normal conversion is not slowed by error calculations.

The calibration procedure utilizes a known waveform as the calibration signal, such as a sine wave signal, a sum of several sine wave signals, a saw-tooth signal, a triangle wave signal, etc. In an exemplary embodiment that is described below, the calibration scheme for sinusoidal calibration signals is described, but it should be understood that other waveform types may be employed. The scheme (primarily of the parent application) may be decomposed into the following exemplary functional blocks, each of which is described in further detail below: First is a processor for estimating the frequency of the analog input s(t), where the estimate ω̂ is computed from the quantized output x(k) of the ADC. Second is a linear time invariant FIR filter having as input the output x(k) of the ADC, such that characteristics of the filter include coefficients which are set to minimize the noise gain. The filter output ŝ(k) is a reconstruction of the analog calibration signal at the given sampling instants (in principle, a continuous-amplitude discrete-time signal). And, a third functional block is a processor for computing an updated reconstruction table in dependence upon x(k) and ŝ(k).

A derivation of a calibration scheme primarily in accordance with the invention of the parent application is summarized in Table 1.

TABLE 1

Calibration scheme based on:
N quantized values of the sampled calibration signal
s(k) (e.g., {x(0), . . . , x(N − 1)} where x(k) = $Q_b$[s(k)]).

1. Calculate an estimate ω̂ of the calibration frequency from {x(0), . . . , x(N − 1)}. An estimate ω̂ is given by (14) below.
2. For k = 0, . . . , N − 1 construct ŝ(k) by aid of linear filtering. The FIR filter (7) has coefficients (10)–(13) with ω there replaced by ω̂ from step 1. The variable L (from (7) and (10)–(13)) is determined from the required number of effective bits in the reconstruction, $b_{IMP}$. (Where $b_{IMP}$ may be computed by:

$$b - \frac{10 \log_{10} NG}{6} \approx b - 0.50 + 1.67 \log_{10} L.$$

TABLE 1-continued

Calibration scheme based on:
N quantized values of the sampled calibration signal
s(k) (e.g., {x(0), . . . , x(N − 1)} where x(k) = $Q_b$[s(k)]).

3. For k = L, . . . , N − 1 and x(k) = $x_i$ update
the table entry $s_i$ for some i ∈ {0, . . . , M − 1}
from ŝ(k) utilizing (17). The table entries
may be initialized by (15).

Initially, the calibration signal is sampled and quantized. The calibration signal s(t) is a continuous time (t[s] is the time instant) sine wave with frequency F [Hz], amplitude A [Volts] where A>0, and initial phase φ [radians], that is $$s(t) = A \sin(2\pi F t + \phi). \tag{1}$$

The frequency F is in the range (0, $F_s$/2) where $F_s$ [Hz] is the sampling frequency. An ideal S/H circuit with sampling rate $F_s$ results in a discrete time signal $$s(k) = A \sin(\omega k + \phi) \tag{2}$$

where $\omega = 2\pi F/F_s$ is the normalized (angular) frequency in (0, π), and k is a running (integer) time index.

Consider a b-bits uniform quantizer. For simplicity, but without loss of generality, let the maximum swing of the ADC be ±1. Then, the resolution is $$\Delta = \frac{1}{2^{b-1}}. \tag{3}$$

A b-bit quantized signal x(k)=$Q_b$[s(k)] can be modeled as mathematically represented by (4) and as shown in J. G. Proakis and D. M. Manolakis, *Digital Signal Processing-Principles, Algorithms and Applications*, Prentice Hall International, Third Edition, 1996, Chapter 9.2, pp. 748–762, which is hereby incorporated by reference in its entirety herein, $$x(k) = s(k) + e(k) \tag{4}$$

where $Q_b$[•] denotes a b-bits quantizer and e(k) is white zero mean quantization noise with variance $$\sigma^2 = \frac{\Delta^2}{12} = \frac{2^{-2b}}{3}. \tag{5}$$

The model from (4)–(5), describing the quantized output of the ADC, is known to be valid for small quantization steps Δ and when s(k) traverses several quantization levels between two successive samples.

A quality measure for ADCs is the signal-to-quantization noise ratio (SQNR) defined as the ratio of the signal power P to the power of the quantization noise, that is $$SQNR = \frac{P}{\sigma^2} = \frac{3P}{2^{-2b}} \tag{6}$$

where (5) was used in the second equality. For s(k) in (2), it holds that P=$A^2$/2. From (6) it is evident that each additional bit increases SQNR by 20 $\log_{10} 2 \approx 6$ dB.

Secondly, in order to reconstruct the calibration signal s(k) from the quantized inputs x(k), an L-th order FIR filter is employed, that is $$\hat{s}(k) = \sum_{l=0}^{L} c_l x(k-l). \tag{7}$$

Filter coefficients ({$c_L$} from L=0 to L) are sought such that ŝ(k)≡s(k) for a noise-free sinusoidal input (2) (after that the transient died away). In addition, {$c_L$} is sought such that the sensitivity against white (quantization) noise is minimized. The sensitivity against noise, or the so called noise gain (NG), is $$NG = \sum_{l=0}^{L} c_l^2. \tag{8}$$

The optimization problem to be solved is $$\min_{c_0,\ldots,c_L} NG \text{ subject to } s(k) = \sum_{l=0}^{L} c_l s(k-l) \tag{9}$$

where s(k) is the sine-wave in (2). This optimization problem was solved in P. Händel, "Predictive digital filtering of sinusoidal signals", IEEE Transactions on Signal Processing, Vol. 46, No. 2, pp. 364–375, 1998, which is hereby incorporated by reference in its entirety herein, and the following result holds true $$c_l = \frac{(L+1)\cos l\omega + (S_s - S_c)\cos\omega(l+2) - 2S_{sc}\sin\omega(l+2)}{2(S_c S_s - S_{sc}^2)}, \tag{10}$$

$$l = 0, \ldots, L$$

where $$S_c = \sum_{l=1}^{L+1} \cos^2 l\omega \tag{11}$$

$$S_s = \sum_{l=1}^{L+1} \sin^2 l\omega \tag{12}$$

$$S_{sc} = \sum_{l=1}^{L+1} \sin l\omega \cdot \cos l\omega. \tag{13}$$

The reconstruction filter may be composed of (7) where the coefficients are determined by (10)–(13) with ω there replaced by an estimate ω̂. Obtaining an estimate ω̂ from the A/D output x(k) is described below.

Thirdly, the frequency of the calibration signal s(t) is estimated. The filter coefficients (10)–(13) do not depend on the initial phase or the amplitude of the calibration signal s(t); they only depend on ω. Several methods may be used to estimate the frequency of a noise corrupted sinusoidal signal. For example, D. C. Rife and R. R. Boorstyn, "Single tone parameter estimation from discrete-time observations", IEEE Transactions on Information Theory, Vol. IT-20, No. 5, pp. 591–598, 1974, which is hereby incorporated by reference in its entirety herein, shows that frequency estimation may be mathematically characterized as $$\hat{\omega} = \arg\max_{\omega} \left| \sum_{k=0}^{N-1} x(k) e^{i\omega k} \right|^2. \quad (14)$$

The maximization of (14) may be performed by aid of the fast Fourier transform followed by an iterative minimization. Using the estimate $\hat{\omega}$ from (14) in place of $\omega$ in (10)–(13) completes the reconstruction of s(k) from x(k).

And fourthly, a reconstruction table may be updated using the following exemplary algorithm. The scheme is based on the expression for the optimal, in the sense that $E[e(k)^2]$ is minimized, reconstruction levels in scalar quantization, as derived by S. P. Lloyd, "Least squares quantization in PCM", IEEE Transactions on Information Theory, Vol. IT-28, pp. 127–135, March 1982, which is hereby incorporated by reference in its entirety herein.

The quantized output, x(k), from the ADC has $M=2^b$ possible different values at time instant k. Let these be $$\{x_0, \ldots, x_{M-1}\} \quad (15)$$

where $x_i$ corresponds to the i-th level of a uniform quantizer. For $k \in \{L, L+1, \ldots, N-1\}$, let $A_i(m)$ be the number of times x(k) has been equal to $x_i$, for $L \leq k \leq m$, and let $A_i(L-1)=0$. Now the reconstruction table $$\{s_0, \ldots, s_{M-1}\} \quad (16)$$

can be constructed from $\hat{s}(k)$ as follows: Let $s_i$ be assigned the initial values $s_i = x_i$, $i=0, \ldots, M-1$. Then, assuming that $x(k)=x_i$ at time instant $k \geq L$, update $s_i$ according to $$s_i \rightarrow \frac{A_i(k) s_i + \hat{s}(k)}{A_i(k) + 1}. \quad (17)$$

After the data has been processed, and the table has been updated, the operation of the quantizer becomes: The input signal produces a sample s(k) which is quantized to $x(k)=x_i$, then the quantized value $x_i$ is remapped, using the updated table, to the output $s_i$.

The formula in (17) calculates an average of estimates for every encountered level in the input signal x(k). An averaging process may be considered as similar to a low pass filter. Thus, for an implementation in which the number of calibration samples is limited (e.g., due to limited calibration time or arithmetic resolution in average calculation, for example), the averaging may be replaced with a low pass filter. Consequently, for a limited number of calibration samples per level, the formula (17) may be approximated with $$s_i \rightarrow C s_i + (1-C) \hat{s}(k), \quad C = \frac{N-2}{N}. \quad (18)$$

Because the level of x(k) (which defines the variable "i") acts as the address for the correction table 350 (of FIG. 4C), the calibration functionality as defined by (18) may be implemented with the "(1−C)" multiplier 485, the summer 490, and the "C" multiplier 495.

Referring again to an alternative embodiment of the invention of the parent application as illustrated in FIG. 4C, the correction table 350 has a two phase functionality for each sample, one read phase and one write phase. The input signal x(k) with level i acts like an address to the correction table 350 in both phases. In phase one, y(k) gets the value $s_i$ from the correction table 350 and holds it until the end of phase two. This value $s_i$ is multiplied by "C" and summed with the estimate $\hat{s}(k)$ multiplied by "(1−C)". In phase two, the output of the summation is written to the correction table 350. During functional data conversion, the correction table 350 is still mapping x(k) to a value $s_i$ on the output y(k), but no write operation to the correction table 350 is being performed. If the correction table 350 is not initialized, then there is likely to be more of a transient response from the filtering function, thus demanding more samples than if the correction table 350 is initialized. That is, as long as the input of the filter 455 is not connected to y(k) (i.e., not engaged in the feedback case that may be activated by switch 330B of FIG. 3A), the correction table 350 may be initialized by a longer calibration phase. The frequency estimation and coefficient calculation may also be accomplished during the initialization step alone, especially if the frequency of the reference input signal s(t) to the ADC 310 does not drift outside the passband of the filter 455.

Figure 5:
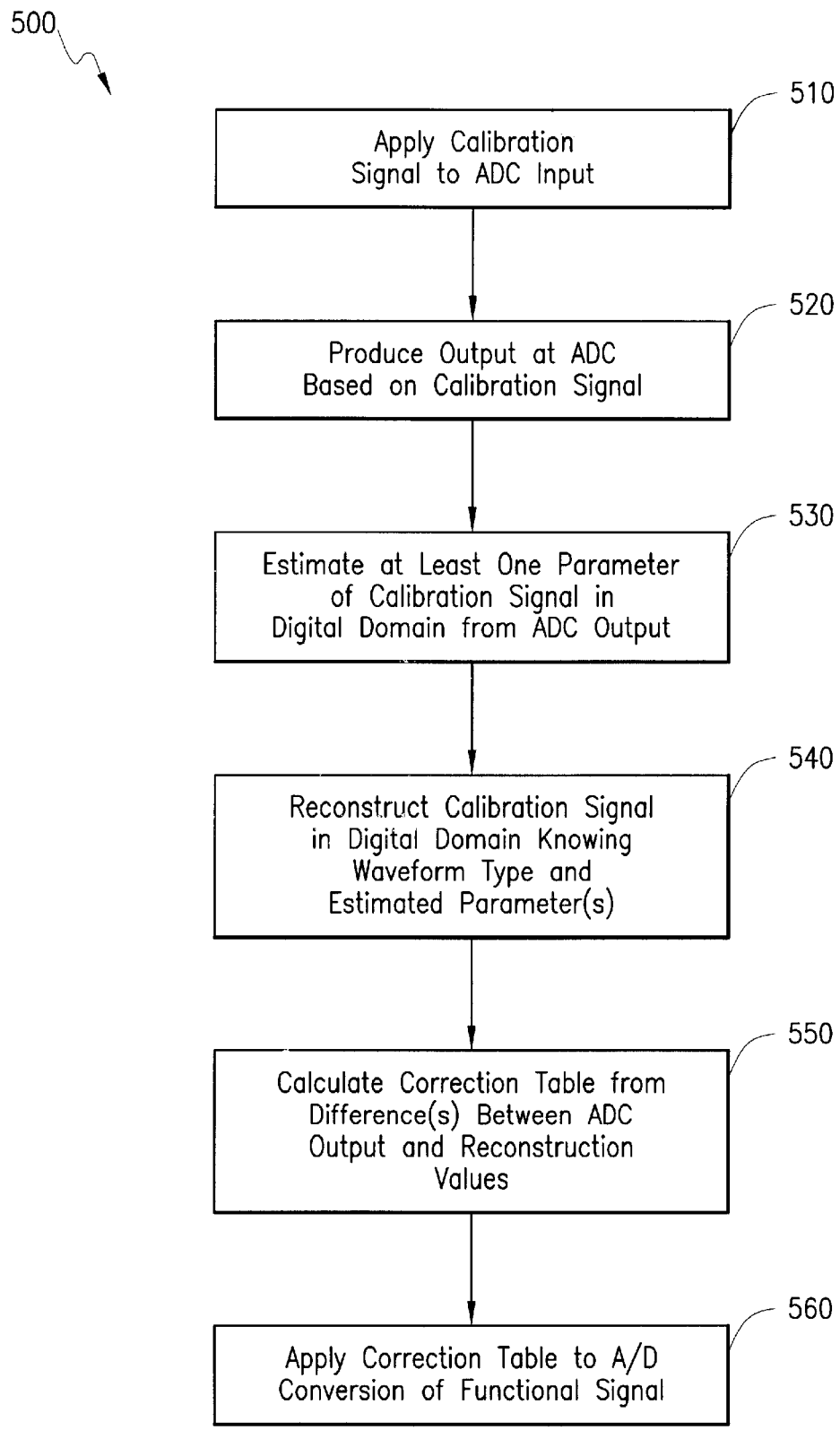
FIG. 5 illustrates a method in flowchart form for calibrating an ADC in accordance with the invention of the parent application.

Referring now to FIG. 5, a method in flowchart form for calibrating an ADC in accordance primarily with the invention of the parent application is illustrated. Flowchart 500 begins with the application of an analog calibration signal to an input of an ADC (step 510). The ADC produces a digital output based on the analog calibration signal input (step 520). Operating in the digital domain, at least one parameter relating to the calibration signal is estimated based on the digital output of the ADC (step 530). The calibration signal is reconstructed in the digital domain based on the type of waveform of the analog calibration signal and the one or more estimated parameters (step 540). A reconstruction data structure may be created and stored. The digital outputs of the ADC are compared to the values in the reconstruction data structure to determine a correction data structure (step 550). The correction data structure (e.g., a table in a memory) may then be applied to A/D conversion of functional signals (step 560).

The ADC is therefore calibrated by applying the entries in the correction data structure to the digital ADC outputs of a functional signal. Advantageously, the correction data structure may be updated continuously to account for, e.g., temperature drift. The method described in the flowchart 500 may be considered a first coarse tuning phase that may be alternatively followed by a finer tuning of the correction table in a second phase. During the second phase, the data passed through the correction table is input to the calibrator. The second phase may also stand alone for satisfactory calibration as long as the correction table is initialized.

The invention of the parent applications provides for calibration of ADCs working in a relatively narrow frequency band around the calibration signal frequency. However, the method of the parent application does not solve the problem of wide-band calibration of ADCs because the linearity errors that need to be compensated for are frequency dependent.

The present invention provides for calibration of ADCs intended to operate in a broad frequency band. Certain embodiments of the present invention may involve the following exemplary aspects. Firstly, in order to deal with the frequency dependence of the linearity errors, calibration may be performed using a sequential multi-tone reference signal. That is, the reference signal may include several single-tone sinusoids at different frequencies in sequence. Secondly, the reference signal reconstruction is fully adaptive and performs both the frequency estimation and signal reconstruction on a sample-by-sample basis, enabling a more efficient implementation. The present invention minimizes the communication required between the calibration software and the peripheral calibration equipment (e.g., a sine-wave generator, switching devices, etc.) since the calibration algorithms autonomously detect the reference frequency and the instants at which the frequency changes. Thus, no advanced synchronization between the reference signal generator and the calibration software is needed. All of the calibration procedures can be performed on the digital side of the ADC, requiring only binary control logic/communication to indicate calibration versus correction between the analog and digital side. Thirdly, the calibration may be performed using discontinuous reference sequences of arbitrary length. This allows the ADC system to initiate a calibration sequence whenever suitable (e.g. when work load is low), terminate it at any time, and continue it again when possible.

Figure 6A:
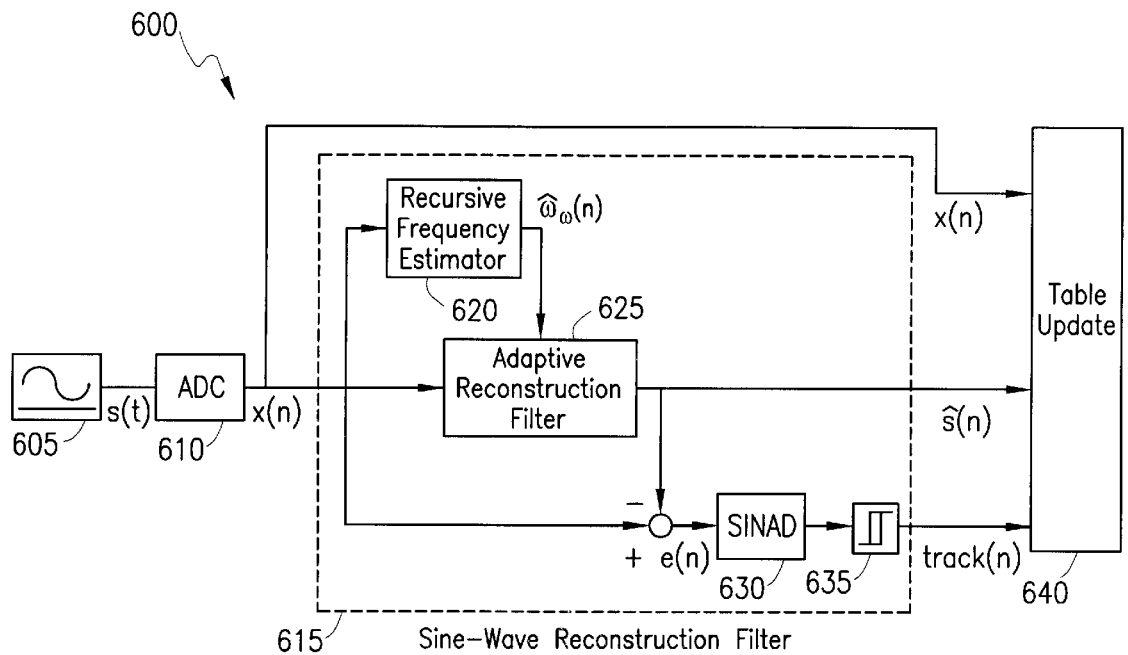
FIG. 6A illustrates exemplary details of one embodiment of calibration logic in accordance with the present invention.

Referring now to FIG. 6A, exemplary details of one embodiment of calibration logic in accordance with the present invention are illustrated generally at 600. The calibration logic includes a sine-wave reconstruction filter 615 and a correction table update block 640. The sine-wave reconstruction filter 615 includes of a recursive frequency estimator 620, an adaptive reconstruction filter 625, and a signal-to-noise and distortion ratio (SINAD) estimator 630 with hysteresis logic 635. The recursive frequency estimator 620 and the adaptive reconstruction filter 625 interact to assure fast and accurate convergence of the reconstruction filter.

As shown in FIG. 6A generally at 600, a reference signal generator 605 produces a reference signal s(t) which is used as an input to the ADC 610 to be calibrated. It should be noted that the ADC 610 may correspond to, for example, the ADC 310 (e.g., of FIGS. 3A, 3B, and 4A). The ADC 610 outputs a signal x(n) to the sine-wave reconstruction filter 615, which produces a reconstructed signal ŝ(n). Using an estimate of the signal-to-noise and distortion ratio (SINAD), a determination is made as to whether the reconstruction filter has converged. If the adaptive reconstruction filter 625 has converged at time instant n, the SINAD estimator 630 with hysteresis logic 635 outputs a value track (n) equal to 1. Otherwise track(n) is set to a value of 0. If track(n) has been set to 1, a correction table of the correction table update block 640 is updated using x(n) and ŝ(n) using a scheme that is discussed further hereinbelow.

Recursive Frequency Estimator

The recursive frequency estimator 620 enables the adaptive reconstruction filter 625 to converge rapidly to the global minimum. The novel recursive frequency estimator is based upon a least-mean-square (LMS) algorithm which operates on a sample-by-sample basis. The recursive frequency estimation may be achieved in four main steps:

1. Initialize the real scalar parameter $\hat{\theta}$ such that $-2<\hat{\theta}<2$.
2. For each sample n, update $\hat{\theta}$ using $$\hat{\theta}(n) = \hat{\theta}(n-1) + \mu_\omega x(n-1)(x(n) - \hat{\theta}(n-1)x(n-1) + x(n-2)) \tag{19}$$

3. Estimate the discrete (angular) frequency ω of the input signal from $\hat{\theta}(n)$ using $$\hat{\omega}_\omega(n) = \arccos \frac{\hat{\theta}(n)}{2} \tag{20}$$

4. Increase n and repeat from step 2.

The index ω is used to distinguish the step size and frequency estimate associated with the recursive frequency estimator from the same qualities associated with the reconstruction filter. Here $\mu_\omega$ is the step size of the LMS algorithm. To ensure stability of the LMS algorithm, the step size must fulfil the following condition:

$$0 < \mu_\omega < \frac{2}{\alpha^2} \tag{21}$$

where α is the amplitude of the ADC output x(n). Although the least-mean-square algorithm is used in this example, many other recursive algorithms known to those skilled in the art may be used instead.

Adaptive Reconstruction Filter

Figure 7:
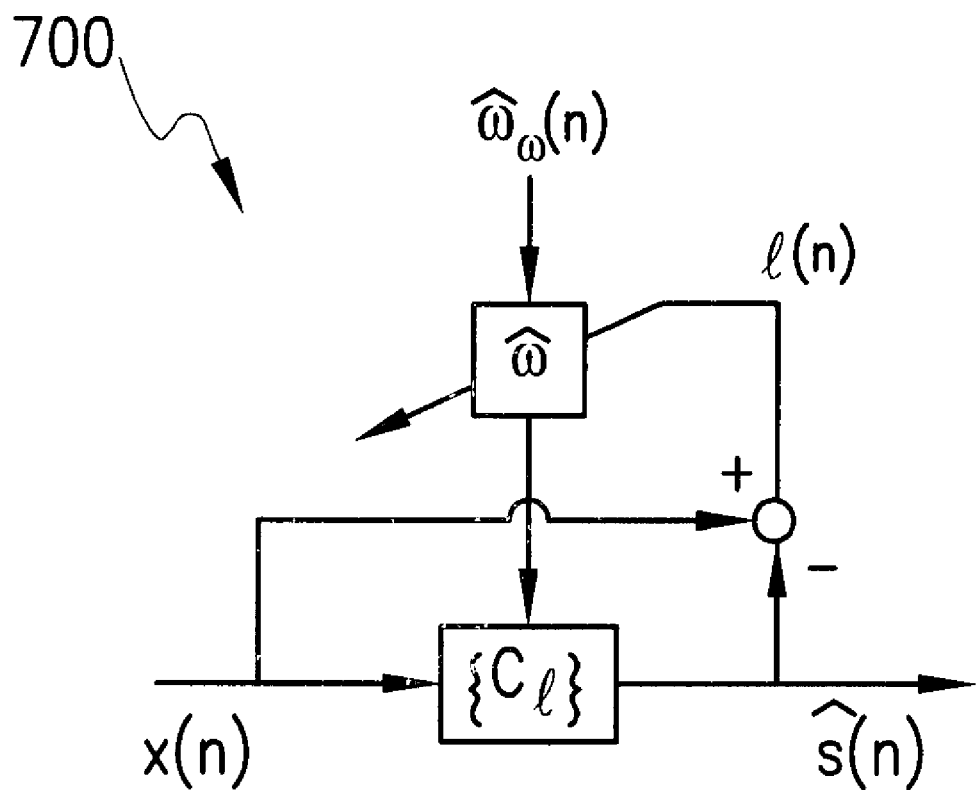
FIG. 7 illustrates an exemplary embodiment of an adaptive reconstruction filter in accordance with the present invention.

The signal reconstruction may be performed by a FIR filter, for example, that is updated using a constrained LMS algorithm. Referring now to FIG. 7 an exemplary embodiment of an adaptive reconstruction filter 625 in accordance with the present invention is illustrated generally at 700. Let $C=[c_0, \ldots, c_L]^T$ and $X(n)=[x(n), \ldots, x(n-L)]^T$, then the output of the filter is $$\hat{s}(n) = C^T X(n) = \sum_{l=0}^{L} c_l x(n-l) \tag{22}$$

where L is the length of the filter, e.g., the number of filter coefficients. The filter coefficients are constrained to $$c_l = \frac{(L+1)\cos\omega l + (S_s S_c)\cos\omega(l+2) - 2S_{sc}\sin\omega(l+2)}{2(S_c S_s - S_{sc}^2)}, \tag{23}$$

$$l = 0, 1, \ldots, L$$

through the properties of the filter update algorithm. The LMS algorithm may be normalized, e.g., the step size μ is dependent on the signal power $\|X(n)\|^2$ as shown in Equation 27 hereinbelow.

As described hereinabove, the adaptive reconstruction filter interacts with the recursive frequency estimator. This interaction is necessary to ensure that the adaptive reconstruction filter converges to the global minimum, and not to any of the numerous local minima in the close neighborhood of the global minimum. The filter algorithm described hereinbelow ensures that the filter converges to a frequency close to that obtained from the recursive frequency estimator (within some tolerance $\delta\hat{\omega}_\omega$). In order to improve the performance of the reconstruction filter, the filter updating may be halted when the filter has converged, at which time the filter parameters are stored. A benefit of halting the converged filter is that small coefficient variations around the optimal values due to the non-zero step size will not perturb the reconstructed signal ŝ(n).

Adaptive Reconstruction Filter Algorithm

An adaptive reconstruction filter scheme in accordance with certain embodiments of the present invention may be performed in seven main steps:

1. Initialize the filter coefficients using Equation 23 and a suitable ω, e.g. ω=π/2.
2. For each sample n, if $\hat{\omega}_\omega(n)>0$ let $$\Delta\omega(n) = \frac{|\hat{\omega}(n) - \hat{\omega}_\omega(n)|}{\hat{\omega}_\omega(n)} \tag{24}$$

$$\hat{\omega}(n) = \begin{cases} \hat{\omega}(n), & \Delta\omega(n) \leq \delta \\ \hat{\omega}_\omega(n), & \Delta\omega(n) > \delta \end{cases} \tag{25}$$

3. Reconstruct $\hat{s}(n)$:

$$\hat{s}(n) = C^T(n)X(n) = \sum_{l=0}^{L} c_l(n)x(n-l) \quad (26)$$

If the value of track(n−1)=1 (as explained further hereinbelow under "Convergence Detection"), then the adaptive reconstruction filter has converged, and the updating steps 4, 5, and 6 are not executed, e.g. processing may continue at step 7.

4. Calculate the step size $\mu$:

$$\mu = \frac{\overline{\mu}}{1 + \|X(n)\|^2} \quad (27)$$

5. Update $\hat{\omega}$:

$$\hat{\omega}(n+1) = \hat{\omega}(n) - \mu \frac{2}{L}(x(n) - C^T(n)X(n)). \quad (28)$$

$(x(n-1)\sin(\hat{\omega}(n)) +$ $2x(n-2)\sin(2\hat{\omega}(n)) + \ldots + Lx(n-L)\sin(L\hat{\omega}(n)))$ 6. Update C:

$$S_c = \sum_{l=1}^{L} \cos^2\hat{\omega}l, \; S_c = \sum_{l=1}^{L+1} \sin^2\hat{\omega}l, \; S_{sc} = \sum_{l=1}^{L+1} \sin\hat{\omega}l\cos\hat{\omega}l \quad (29)$$

$$c_l = \frac{(L+1)\cos\hat{\omega}l + (S_s - S_c)\cos\hat{\omega}(l+2) - 2S_{sc}\sin\hat{\omega}(l+2)}{2(S_cS_s - S_{sc}^2)},$$

$l = 0, 1, \ldots, L$ $$C(n+1) = [c_0(n+1), \ldots, c_L(n+1)]^T \quad (30)$$

7. Increase n and repeat from step 2.

The algorithm is stable when the normalized step size is $0 < \overline{\mu} < 2$, although $\overline{\mu}$ will typically be much less than 2 to achieve low-noise reconstruction of the sine wave. The convergence test threshold $\delta$ is a design variable that should be chosen with care. It is preferably small enough not to let $\hat{\omega}$ converge to a false minimum, yet large enough not to let the estimation noise in $\hat{\omega}_\omega$ perturb $\hat{\omega}$. A typical value for $\delta$ is, for example, approximately 0.05 when using a filter of length L=100. Although the constrained least-mean-square algorithm is used in this example, many other adaptive filtering algorithms known to those skilled in the art may be used instead.

Convergence Detection

To detect whether the filter has converged or not, a convergence detector in the form of SINAD estimator 630 is used. The SINAD estimator 630 at 600 (of FIG. 6A) estimates the signal-to-noise and distortion ratio for the $L_s$ latest samples as $$SINAD(n) = 20\log\left(\frac{\sum_{k=0}^{L_s} \hat{s}^2(n-k)}{\sum_{k=0}^{L_s} (x(n-k) - \hat{s}(n-k))^2}\right)^{\frac{1}{2}} \quad (31)$$

where $L_s$ is a design variable. The SINAD estimate is then compared to a design variable threshold $\gamma$. If the SINAD estimate is greater than $\gamma$ (plus some hysteresis level provided by hysteresis logic 635), the filter has converged and is reconstructing a usable sine wave. The output signal track(n) is then set to a value of 1. When SINAD estimate falls below $\gamma$ (minus a hysteresis), the filter is no longer properly converged, possibly because the input frequency has changed, and the value of track(n) is set to 0.

The output track(n) of the convergence detector ultimately determines whether the present sample x(n) and the reconstructed signal $\hat{s}(n)$ are used to update the correction table or not. Although in this example a SINAD detector is used to detect convergence of the adaptive filter, alternatively other convergence detectors known to those skilled in the art may be used.

Updating the Correction Table

The correction table of the correction table update block 640 includes $M=2^b$ entries $\{s_0, \ldots s_{M-1}\}$, where $s_i$ corresponds to the i-th output level $x_i$ of the ADC 610. Let $A_i(m)$ be the number of times x(n) has been equal to $x_i$ when the adaptive reconstruction filter 625 was converged and $n \leq m$. That is $$A_1(m) = \text{count}_n \{x(n) = x_1, \; track(n) = 1 \; and \; n \leq m\}. \quad (32)$$

Correction table updating involves two main operations:
1. Initialize the correction table, e.g. $s_i = x_i$, $i=0, \ldots, M-1$, before the first calibration sequence.
2. For each sample n, if track(n)=1, update $s_i$ with $$s_i \rightarrow \frac{A_i(n)s_i + \hat{s}(n)}{A_i(n) + 1} \quad (33)$$

In contradistinction to existing approaches, the correction table of the present invention is not reset when the reference signal changes frequency. Consequently, the correction table may be useable over a greater input frequency range than with prior approaches. One scheme for changing the frequency of the reference signal during calibration is the use of step-wise changes in frequency. The reference signal frequency is kept at a constant frequency for a long enough time for frequency adaptation and some table updates to be accomplished. This time period may be estimated or determined based on experimentation, for example. It should be noted that the step-sizes between calibration frequencies need not be equidistant. For example, frequency steps may be made denser around certain desired frequency subranges and less dense, or nonexistant, in other subranges.

Correction Scheme

Figure 6B:
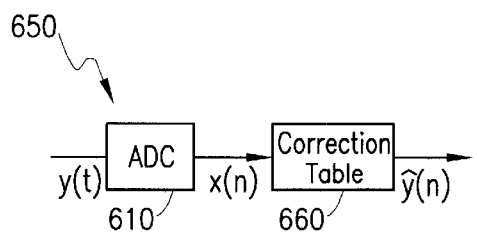
FIG. 6B illustrates exemplary details of one embodiment of correction logic in accordance with the present invention.

Referring now to FIG. 6B, exemplary details of one embodiment of correction logic in accordance with the present invention are illustrated generally at 650. During normal operation of the ADC, a correction table 660, which has been previously calibrated according to the above procedure, is used to correct the output values of the ADC 610. Assuming that the input y(t) produces the ADC output $x(n)=x_j$, then the quantified value $x_i$ is remapped using the updated table to $\hat{y}(n)=s_i$. Thus, a corrected value of $\hat{y}(n)$ is output by the correction table 660 in response to the input y(t) into the ADC 610.

Figure 8:
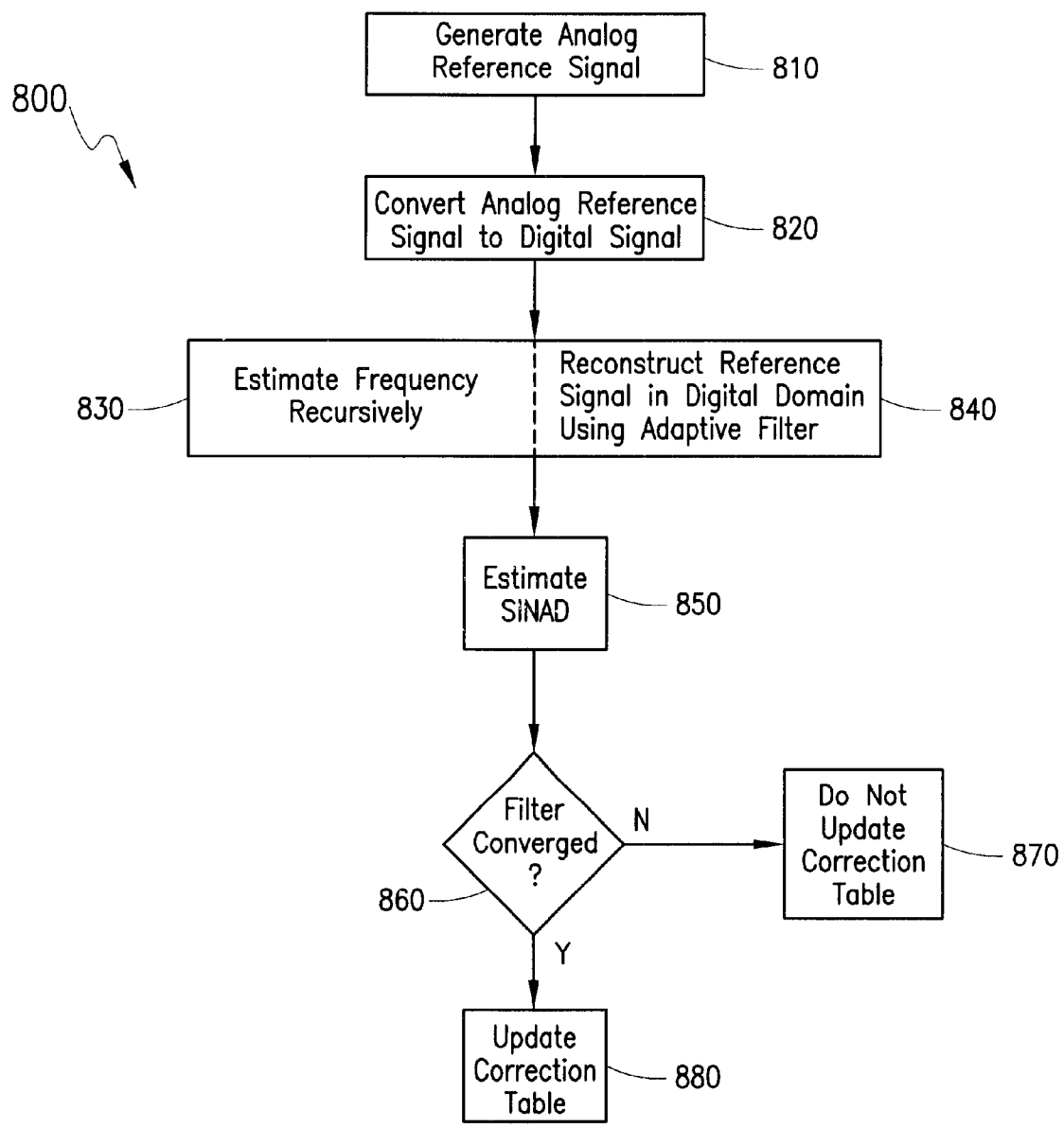
FIG. 8 illustrates an exemplary method in flowchart form for use in an ADC calibration procedure in accordance with the present invention.

Referring now to FIG. 8, an exemplary method in flowchart form for use in an ADC calibration procedure in accordance with the present invention is illustrated generally at 800. First, an analog reference signal is generated (step 810). The analog reference signal is then converted to a digital signal (step 820). The frequency of the analog signal is estimated recursively in the digital domain (step 830) while the reconstruction of the reference signal in the digital domain using an adaptive filter (step 840) is performed. It should be noted that steps 830 and 840 need not be performed simultaneously. Next, the signal-to-noise and distortion ratio (SINAD) is estimated (step 850). The SINAD estimation is used to determine whether the adaptive filter has converged (step 860). If it is determined that the filter has converged, the correction table is updated (step 880). Otherwise, the correction table is not updated (step 870).

Performance

The performance of the calibration method of the present invention was evaluated using experimental data from an Analog Devices AD876 10-bit ADC. The experimental data used was composed of eight 32 K sequences (N=32768). The sequences were obtained using a sampling frequency $F_s$=20.48 MHz and using a sine wave as input to the ADC. Eight different test frequencies $F_k$ (for k=1, ..., 8) where employed, where $F_k$=m$F_s$/N for m={4001,5715,7429,9143, 10857,12571,14285,16001}. The amplitude of the input signal was 0.95 of full scale (−0.45 dBFS).

Figure 9A:
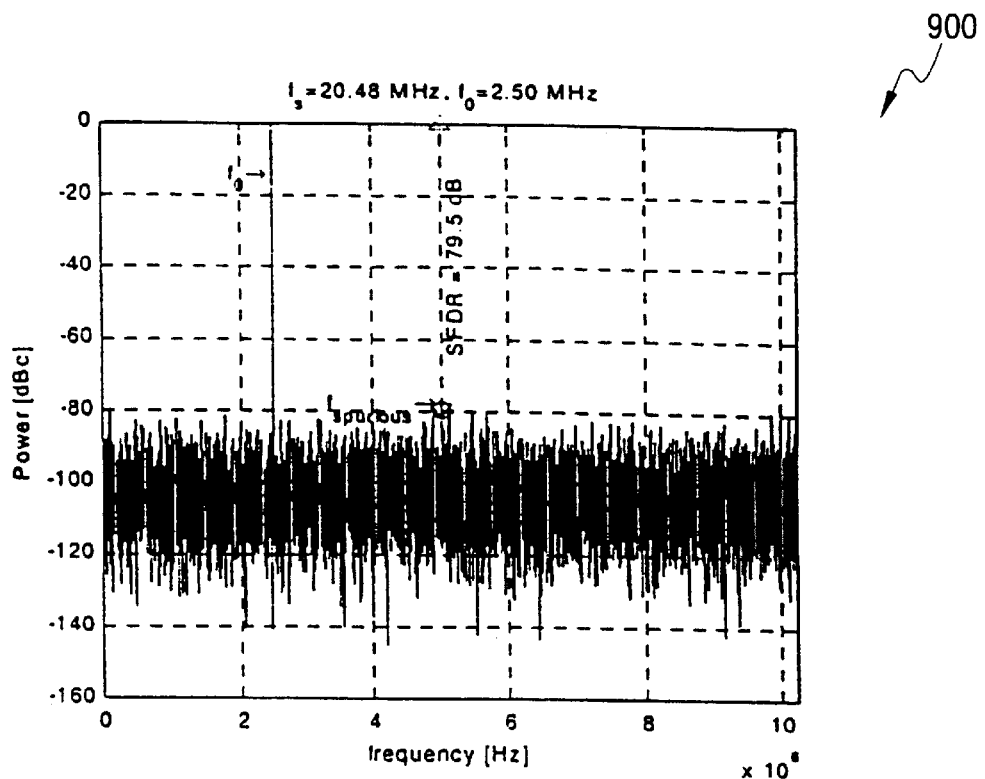
FIGS. 9A and 9B illustrate exemplary corrected and uncorrected performance characteristics in graphical form in accordance with the present invention.
Figure 9B:
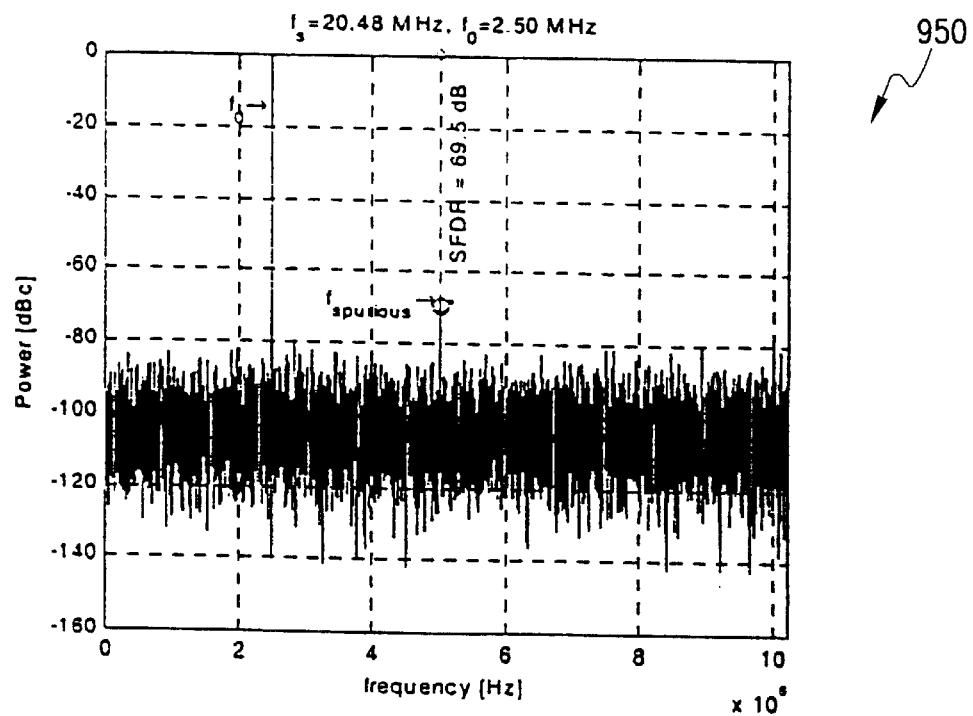

The calibration was performed using seven of the sequences, and correction was performed and evaluated on the eighth. The spurious-free dynamic range (SFDR) was calculated for the test signal before and after correction. Typically, the original converter is characterized by an uncompensated SFDR of 65 dB and a noise floor at approximately −90 dBFS. Referring now to FIGS. 9A and 9B, exemplary corrected (900) and uncorrected (950) performance characteristics in graphical form in accordance with the present invention are illustrated. The correction table was generated using all frequencies except the test frequency. The SFDR improvements for all eight test cases are presented in Table 2.

TABLE 2

| $F_{test}$ [MHz] | SFDR Improvement [db] |
|---|---|
| 2.50 | 10.00 |
| 3.57 | 7.14 |
| 4.64 | 2.58 |
| 5.71 | 8.54 |
| 6.79 | −1.86 |
| 7.86 | 1.10 |
| 8.93 | 4.17 |
| 10.0 | −0.20 |

The present invention has several advantages over pre-existing approaches. One advantage is that the present invention is robust against variations in the analog reference signal because of the adaptivity of the reconstruction algorithms. Hence, the calibration signal generator does not have to be long-term stable, only relatively spectrally pure. Another advantage of the present invention is that the calibration scheme may be fully implemented in software. The calibration procedures are performed on the digital side of the ADC, requiring only binary control logic/communication for calibration and correction between the analog and digital side. Another advantage occurs as a result of the fact that the calibration algorithms are not real-time critical applications. If the sampled reference signal is stored in a memory, the calibration algorithms may be processed in the background on a low priority level while the ADC is in normal operation. Furthermore, sequential multi-tone calibration is advantageous due to its relatively simple implementation. The reference signal may be generated from a single voltage-controlled oscillator, which is a simplification compared to those calibration schemes that require a separate digital-to-analog converter. In another advantage, calibration may be performed using reference sequences of any length that are only longer than the settling time for the reconstruction filter. Moreover, the calibration procedures may be initiated, interrupted, and continued at any time suitable for or convenient to the rest of the system.

Although preferred embodiment(s) of the method, arrangement, and system of the present invention have been illustrated in the accompanying Drawings and described in the foregoing Detailed Description, it will be understood that the present invention is not limited to the embodiment (s) disclosed, but is capable of numerous rearrangements, modifications, and substitutions without departing from the spirit and scope of the present invention as set forth and defined by the following claims.

What is claimed is:

1. An arrangement for calibrating an analog-to-digital conversion, said arrangement comprising:

an analog-to-digital converter adapted for receiving an analog signal and producing a digital signal;

a recursive estimator configured for computing at least one parameter related to said analog signal from said digital signal; and an adaptive filter configured for receiving said at least one parameter and said digital signal and producing therefrom a digital representation of said analog signal, said adaptive filter adapting to a change of said at least one parameter.

2. The arrangement of claim 1 wherein said at least one parameter comprises a frequency of said analog signal.

3. The arrangement of claim 1, further comprising:

a memory for storing values, said values based, at least in part, on said digital representation of said analog signal.

4. The arrangement of claim 3, wherein said memory stores values related to said digital representation only when said adaptive filter has converged.

5. The arrangement of claim 1, further comprising:

a convergence detector for detecting a convergence of said adaptive filter.

6. The arrangement of claim 5, wherein said convergence detector comprises a signal-to-noise and distortion ratio (SINAD) detector.

7. The arrangement of claim 1, wherein said recursive estimator uses a least-mean-square (LMS)-based scheme to compute said at least one parameter, and said adaptive filter uses a constrained least-mean-square (LMS)-based scheme for producing said digital representation.

8. The arrangement of claim 1, wherein said adaptive filter further adapts to said digital signal received thereat.

9. The arrangement of claim 1, wherein said recursive estimator and said adaptive filter operate on a sample-by-sample basis.

10. The arrangement of claim 1, wherein said analog signal comprises a single tone that is stepped over a plurality of frequencies.

11. A method for calibrating an analog-to-digital conversion, said method comprising the steps of:
converting an analog reference signal to a digital signal;
recursively estimating at least one parameter related to said analog reference signal from said digital signal; and
adaptively reconstructing a digital representation of said analog reference signal from said digital signal and said at least one parameter, said step of adaptively reconstructing comprising the step of adapting to a change of said at least one parameter.

12. The method of claim 11, wherein said at least one parameter comprises a frequency of said analog reference signal.

13. The method of claim 11, further comprising the step of:
storing at least one value responsive to said digital representation in a correction table if the reconstruction of said step of adaptively reconstructing has converged.

14. The method of claim 11, further comprising the step of:
determining if the reconstruction of said step of adaptively reconstructing has converged.

15. The method of claim 14, wherein said step of determining comprises the step of determining a signal-to-noise and distortion ratio (SINAD) responsive to said digital signal and said digital representation.

16. The method of claim 11, wherein said step of recursively estimating is performed using a least-mean-square (LMS)-based scheme, and said step of adaptively reconstructing is performed using a constrained least-mean-square (LMS)-based scheme.

17. The method of claim 11, wherein said step of adaptively reconstructing further comprises the step of adapting to said digital signal.

18. The method of claim 11, wherein said step of recursively estimating and adaptively reconstructing are performed, at least partially, in software.

19. The method of claim 11, further comprising the step of:
generating said analog reference signal using a single tone that is stepped over a plurality of frequencies.

20. The method of claim 11, wherein said steps of recursively estimating and adaptively reconstructing are performed on a sample-by-sample basis.

21. An arrangement for calibrating an analog-to-digital conversion, said arrangement comprising:
an analog-to-digital converter adapted for receiving an analog calibration signal and producing a digital signal;
a recursive estimator configured for computing a first parameter related to said analog calibration signal from said digital signal;
an adaptive filter configured for receiving said first parameter and said digital signal and producing therefrom a digital representation of said analog calibration signal, said adaptive filter adapting to a change in said first parameter; and
a correction table for storing at least one value therein, said at least one value based, at least in part, on said digital representation of said analog calibration signal.

22. The arrangement of claim 21, wherein said first parameter comprises a frequency of said analog calibration signal.

23. The arrangement of claim 22, wherein said correction table is not reset upon a change in said first parameter of said analog calibration signal.

24. The arrangement of claim 21, further comprising:
a convergence detector for detecting a convergence of said adaptive filter.

25. The arrangement of claim 21, wherein said correction table stores said at least one value only when said adaptive filter has converged.

26. The arrangement of claim 21, wherein said adaptive filter determines a second parameter related to said analog calibration signal based on, at least in part, said digital signal.

27. The arrangement of claim 26, wherein said adaptive filter uses said first parameter for adapting when a differential between said first parameter and said second parameter exceeds a predetermined threshold.

28. The arrangement of claim 26, wherein said adaptive filter uses said second parameter for adapting when a differential between said first parameter and said second parameter is lower than a predetermined threshold.

29. A method for calibrating an analog-to-digital conversion, said method comprising the steps of:
converting an analog calibration signal to a digital signal;
recursively estimating a first parameter related to said analog calibration signal from said digital signal;
adaptively reconstructing a digital representation of said analog calibration signal from said digital signal and said first parameter, said step of adaptively reconstructing adapting to a change in said first parameter; and
storing at least one value in a correction table, said at least one value based, at least in part, on said digital representation, if said step of adaptively reconstructing has converged.

30. The method of claim 29, wherein said first parameter comprises a frequency of said analog calibration signal.

31. The method of claim 29, further comprising the step of:
determining if said step of adaptively reconstructing has converged.

32. The method of claim 29, wherein said step of storing is performed only when said step of adaptively reconstructing has converged.

33. The method of claim 29, wherein said step of adaptively reconstructing comprises the step of determining a second parameter related to said analog calibration signal based on, at least in part, said digital signal.

34. The method of claim 33, wherein said step of adaptively reconstructing further comprises the step of using said first parameter for adapting when a differential between said first parameter and said second parameter exceeds a predetermined threshold.

35. The method of claim 33, wherein said step of adaptively reconstructing further comprises the step of using said second parameter for adapting when a differential between said first parameter and said second parameter is lower than a predetermined threshold.

36. An arrangement for calibrating analog-to-digital conversion, said arrangement comprising:
an analog-to-digital converter, said analog-to-digital converter adapted to receive an analog input and to produce a digital output, said analog input corresponding to at least one parameter;
a recursive estimator, said recursive estimator configured to receive said digital output and to estimate a first version of said at least one parameter therefrom; and
an adaptive filter, said adaptive filter associated with a second version of said at least one parameter, said adaptive filter configured to receive said digital output and said first version of said at least one parameter, said adaptive filter further configured to determine at least one value based on, at least in part, said digital output and at least one of said first version of said at least one parameter and said second version of said at least one parameter.

37. The arrangement of claim 36, wherein said at least one parameter comprises a frequency of said analog input.

38. The arrangement of claim 36, wherein said second version of said at least one parameter corresponds to an initialization value.

39. The arrangement of claim 36, wherein said second version of said at least one parameter corresponds to a prior value of said first version of said at least one parameter.

40. The arrangement of claim 36, wherein said adaptive filter determines said at least one value based on said first version of said at least one parameter when a differential between said first version of said at least one parameter and said second version of said at least one parameter is greater than a predetermined threshold.

41. The arrangement of claim 36, wherein said adaptive filter determines said at least one value based on said second version of said at least one parameter when a differential between said first version of said at least one parameter and said second version of said at least one parameter is less than a predetermined threshold.

42. The arrangement of claim 36, further comprising:

a convergence detector, said convergence detector configured to ascertain whether said adaptive filter has converged.

43. The arrangement of claim 42, wherein said convergence detector comprises a signal-to-noise and distortion ratio (SINAD) determiner and a hysteresis implementer.

44. The arrangement of claim 42, wherein said convergence detector is configured to ascertain whether said adaptive filter has converged responsive to said at least one value and said digital output.

45. The arrangement of claim 42, wherein said adaptive filter updates coefficients used to determine said at least one value only when said convergence detector ascertains that said adaptive filter has not converged.

46. The arrangement of claim 36, further comprising:

a corrective unit, said corrective unit including a correction data structure that stores at least one entry derived from said at least one value.

47. The arrangement of claim 46, wherein said corrective unit is adapted to cease updating said correction data structure when said adaptive filter is not converged.

* * * * *

UNITED STATES PATENT AND TRADEMARK OFFICE
CERTIFICATE OF CORRECTION

PATENT NO. : 6,445,317 B2  
DATED : September 3, 2002  
INVENTOR(S) : Henrik Lundin et al.

It is certified that error appears in the above-identified patent and that said Letters Patent is hereby corrected as shown below:

Column 7,
Line 8, replace "the coefficients $c_\wedge$)." with -- the coefficients $c_\ell$). --
Line 10, replace "the coefficients $c_\wedge$)" with -- the coefficients $c_\ell$) --

Column 10,
Line 9, replace "($\{c_L\}$ from L=0 to L)" with -- ($\{c_l\}$ from l=0 to $L$) --
Line 11, replace "$\{c_L\}$" with -- $\{c_l\}$ --

Column 11,
Line 23, replace "$A_1$ (m)" with -- $A_i$ (m) --
Line 30, replace "update $s_l$" with -- update $s_i$ --
Lines 51-54, Equation 18, replace $$"s_i \rightarrow C s_i + (1-C)\,\hat{s}(k), \quad C = \frac{N-2}{N}."$$

with $-- s_i \rightarrow C s_i + (1-C)\,\hat{s}(k), \quad C = \frac{N-2}{N}. --$ Column 14,
Lines 27-32, Equation 23, replace $$"c_l = \frac{(L+1)\cos\omega 1 + (S_s S_c)\cos\omega(\ell+2) - 2S_{sc}\sin\omega(\ell+2)}{2(S_c S_s - S^2_{sc})},"$$

with $$-- c_l = \frac{(L+1)\cos\omega 1 + (S_s - S_c) + \cos\omega(\ell+2) - 2S_{sc}\sin\omega(\ell+2)}{2(S_c S_s - S_{sc}^2)}, --$$

Column 15,
Lines 31-39, Equation 29, replace $$"S_c = \sum_{l=1}^{L} \cos^2\hat{\omega}\,l, \quad S_c = \sum_{l=1}^{L+1} \sin^2\hat{\omega}\,l, \quad S_{sc} = \sum_{l=1}^{L+1} \sin\hat{\omega}\,l\cos\hat{\omega}\,l$$

$$c_l = \frac{(L+1)\cos\hat{\omega}1 + (S_s - S_c)\cos\hat{\omega}(1+2) - 2S_{sc}\sin\hat{\omega}(1+2)}{2(S_c S_s - S^2_{sc})},$$

$$1 = 0,1,\ldots,L\ "$$

with $$c_\ell = \frac{(L+1)\cos\ell\hat{\omega} + (S_s - S_c)\cos\hat{\omega}(\ell+2) - 2S_{sc}\sin\hat{\omega}(\ell+2)}{2(S_c S_s - S^2_{sc})},$$

$$\ell = 0,\ldots,L$$

$$S_c = \sum_{\ell=1}^{L+1}\cos^2\ell\hat{\omega}$$

$$S_s = \sum_{\ell=1}^{L+1}\sin^2\ell\hat{\omega}$$

$$S_{sc} = \sum_{\ell=1}^{L+1}\sin\ell\hat{\omega}\cdot\cos\ell\hat{\omega}. --$$

UNITED STATES PATENT AND TRADEMARK OFFICE
CERTIFICATE OF CORRECTION

PATENT NO.     : 6,445,317 B2
DATED          : September 3, 2002
INVENTOR(S)    : Henrik Lundin et al.

It is certified that error appears in the above-identified patent and that said Letters Patent is hereby corrected as shown below:

Column 16,
Line 34, Equation 32, replace "$A_l$ (m)" with -- $A_i$ (m) --
Line 39, replace "s$i$=$x_l$," with -- $s_i$=$x_i$ --

Column 17,
Line 3, replace "x (n) =$x_l$," with -- x (n) =$x_i$ --

Signed and Sealed this

Nineteenth Day of August, 2003

JAMES E. ROGAN
*Director of the United States Patent and Trademark Office*